United States Patent
Kitada et al.

(10) Patent No.: US 8,828,257 B2
(45) Date of Patent: Sep. 9, 2014

(54) PLASMA PROCESSING APPARATUS AND OPERATION METHOD THEREOF

(75) Inventors: Hiroho Kitada, Kudamatsu (JP); Kazunori Nakamoto, Kudamatsu (JP); Yosuke Sakai, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1115 days.

(21) Appl. No.: 12/379,641

(22) Filed: Feb. 26, 2009

(65) Prior Publication Data

US 2010/0163403 A1 Jul. 1, 2010

(30) Foreign Application Priority Data

Dec. 26, 2008 (JP) ................................. 2008-331817

(51) Int. Cl.
| | |
|---|---|
| H05H 1/00 | (2006.01) |
| H01L 21/306 | (2006.01) |
| C03C 15/00 | (2006.01) |
| C03C 25/68 | (2006.01) |
| C23F 1/00 | (2006.01) |
| H01J 37/32 | (2006.01) |
| H01L 21/687 | (2006.01) |

(52) U.S. Cl.
CPC ....... *H01L 21/68742* (2013.01); *H01J 2237/20* (2013.01); *H01J 37/3244* (2013.01); *H01J 37/32082* (2013.01)
USPC .......................... 216/67; 204/164; 156/345.51

(58) Field of Classification Search
CPC ............ H01J 37/32082; H01J 37/3244; H01L 21/68742
USPC .............................. 216/67; 438/788; 204/164
See application file for complete search history.

(56) References Cited

U.S. PATENT DOCUMENTS

| | | | |
|---|---|---|---|
| 5,622,593 A | 4/1997 | Arasawa et al. | |
| 5,856,906 A * | 1/1999 | Kholodenko et al. | ........ 361/234 |
| 6,646,857 B2 | 11/2003 | Anderson et al. | |
| 2002/0001679 A1 * | 1/2002 | Matsuyama et al. | .......... 427/446 |
| 2009/0029564 A1 * | 1/2009 | Yamashita et al. | ............. 438/788 |
| 2009/0068768 A1 * | 3/2009 | Urbanowicz et al. | .............. 438/9 |

FOREIGN PATENT DOCUMENTS

| | | | |
|---|---|---|---|
| JP | 2002-305188 | 10/2002 | |
| KR | 20070099960 | * 10/2007 | .............. H01L 21/02 |

* cited by examiner

*Primary Examiner* — Nadine Norton
*Assistant Examiner* — Mahmoud Dahimene
(74) *Attorney, Agent, or Firm* — Antonelli, Terry, Stout & Kraus, LLP.

(57) ABSTRACT

In a plasma processing apparatus including a processing chamber in a vacuum container to form plasma in the processing chamber in which pressure is reduced, a sample stage in lower part of inside of the processing chamber and having an upper surface on which a wafer to be processed by plasma is put, a plurality of pins in the sample stage to be moved in vertical direction so that the pins abut against rear side of the wafer to move the wafer up and down over the upper surface of the sample stage, and a plurality of openings formed in the upper surface of the sample stage so that the pins are moved in the openings, gas is fed from supply ports communicating with the openings into the processing chamber through the openings when the wafer is not put on the upper surface of the sample stage.

8 Claims, 7 Drawing Sheets

PLASMA PROCESSING APPARATUS AND OPERATION METHOD THEREOF

BACKGROUND OF THE INVENTION

The present invention relates to a plasma processing apparatus and an operation method thereof of processing a board-shaped sample such as semiconductor wafer in a processing chamber provided in a vacuum container by plasma formed in the processing chamber and more particularly to such a plasma processing apparatus including a sample stage disposed in the processing chamber and on which a sample is placed and a plurality of pins disposed in the sample stage to move the sample up and down above the sample stage and an operation method of the plasma processing apparatus.

The above-mentioned plasma processing apparatus generally includes pins (hereinafter referred to as pusher pins) disposed in the sample stage having an upper surface on which the sample is put in order to place the wafer on the upper surface or separate off the wafer from the upper surface. Driving means for moving the pusher pins up and down may be air drive type or electric motor drive type.

Since the pusher pins are moved while being in contact with the sample, the pusher pins are usually disposed in a decompressed atmosphere. On the other hand, since the driving means is disposed within the atmosphere, sealing part is disposed between the driving means and the pusher pins to keep airtight. For example, there is a method in which axial sealing means using O-ring which abuts against the side of a cylindrical pusher pin to realize airtight sealing as a sealing face is disposed or the circumference of the pusher pin is covered with a bellows-structure member such as elastic bellows and sealing member is disposed therein to hermetically seal the inside of the sealing member from the outside in which driving means of the pusher pin is disposed. In the axial sealing method, a lubricating oil reservoir is sometimes provided in order to reduce a sliding resistance.

As prior arts using such a pusher pin, there are U.S. Pat. No. 6,646,857, JP-A-2002-305188 and U.S. Pat. No. 5,622,593.

U.S. Pat. No. 6,646,857 discloses that a plurality of pusher pins disposed within a sample stage are moved up and down to lift a sample such as semiconductor wafer absorbed onto the upper surface of the sample stage up and then down so that the sample is placed on the upper surface of the sample stage and the circumference of the pusher pins is covered with bellows. JP-A-2002-305188 and U.S. Pat. No. 5,622,593 disclose that a plurality of pusher pins are housed in a sample stage and a driving device for lifting a sample up and down is disposed out of a vacuum container similarly to U.S. Pat. No. 6,646,857.

In U.S. Pat. No. 5,622,593, gas having heat transmission characteristic such as helium (He) gas is fed between the sample placed on the upper surface of the sample stage and the upper surface of the sample stage in order to facilitate heat transmission therebetween, while there is shown the structure in which the gas having the heat transmission characteristic is introduced from an opening formed in an inner wall of a vertical hole of the sample stage in which the pusher pin is housed and is fed through the vertical hole into the rear side of the sample from an opening formed in the upper surface of the sample stage and in which the pusher pin comes in and out.

SUMMARY OF THE INVENTION

In the above-mentioned prior art, the following points are not considered sufficiently and accordingly there arise problems.

That is, as described in U.S. Pat. No. 6,646,857, the bellows are used to seal the circumference of the pusher pins communicating with the inside of the processing chamber from the outside in which the driving means of the pusher pins are disposed in airtight manner and the bellows are generally made of metal such as stainless used steel (SUS) from the viewpoint of corrosion resistance and mechanical strength, although there arises a problem that when active gas goes into the circumference of the pusher pins as described above or when electric discharge is produced by electric field or magnetic field in which gas is fed, metallic element is emitted to contaminate the sample and electric characteristics of a semiconductor device which is a product gotten by processing the sample are adversely affected. Furthermore, in the state that the inside of the vacuum container is not opened in the air and the sample is not subjected to processing such as idling, the gas is not introduced and remaining active gas or floating products in the processing chamber go into space around the pusher pins, so that remaining active gas or floating products are stuck firmly on the inner wall of the bellows to cause the interaction therebetween so that problem of alien substances and metal contaminations is caused in the long term.

Moreover, when inert gas such as helium gas is introduced around the pusher pins, products produced by sticking the active gas on the inner surface of the bellows are peeled off by extending and contracting the bellows when the pusher pins are moved up and down, so that contaminations or alien substances are produced.

Further, in the prior art using the axial sealing member, lubricating oil is used between sealing member such as O-ring and pusher pins to reduce a sliding resistance, so that minute vibration and production of contaminations can be suppressed. However, since the lubricating oil is used, there arises a problem that the coefficient of viscosity of film of lubricating oil formed on the surface of pusher pins is reduced by influence of discharge of plasma, so that the film is stuck firmly to produce contaminations.

It is an object of the present invention to provide a plasma processing apparatus and an operation method of the plasma processing apparatus which can suppress production of alien substances or contaminations to improve reliability.

The above object is achieved by an operation method of a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, and a plurality of openings formed in the upper surface of the sample stage so that the plurality of pins are moved in the openings, gas being fed from supply ports communicating with the inside of the openings into the processing chamber through the openings when the wafer is not put on the upper surface of the sample stage.

Moreover, the above object is achieved by an operation method of a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, and a plurality of openings formed in the upper surface of the sample stage so that the plurality of pins are moved in the openings, gas being fed from supply ports communicating with the inside of the openings into the processing chamber through the openings when the openings are exposed to the processing chamber.

The above object is achieved by an operation method of a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, carrying means to carry the wafer between inside of the processing chamber and outside thereof and deliver the wafer between the sample stage and the plurality of pins when the wafer is lifted above the upper surface of the sample stage and a plurality of openings formed in the upper surface of the sample stage so that the plurality of pins are moved in the openings, gas being fed from supply ports communicating with the inside of the openings into the processing chamber through the openings during delivery of the wafer.

The above object is achieved by a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, and a plurality of openings formed in the upper surface of the sample stage so that the plurality of pins are moved in the openings, gas being fed from gas supply ports communicating with inside of the openings into the processing chamber through the openings when the wafer is not put on the upper surface of the sample stage.

Furthermore, the above object is achieved by a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, and a plurality of openings formed in the upper surface of the sample stage so that the plurality of pins are moved in the openings, gas being fed from gas supply ports communicating with inside of the openings into the processing chamber through the openings when the openings are exposed to the processing chamber.

The above object is achieved by a plasma processing apparatus including a processing chamber disposed in a vacuum container to form plasma in the processing chamber in which pressure is reduced, a sample stage disposed in lower part of inside of the processing chamber and having an upper surface on which a wafer to be processed by plasma is put, a plurality of pins disposed in the sample stage to be moved in vertical direction so that the plurality of pins abut against rear side of the wafer to move the wafer up and down over the upper surface of the sample stage, carrying means to carry the wafer between inside of the processing chamber and outside thereof and deliver the wafer between the sample stage and the plurality of pins when the wafer is lifted above the upper surface of the sample stage and a plurality of openings formed in the upper surface of the sample stage so that the plurality of pins are moved in the openings, gas being fed from gas supply ports communicating with the inside of the openings into the processing chamber through the openings during delivery of the wafer.

Furthermore, in order to achieve the above object, the inside of the openings is pressurized to be higher than the inside of the processing chamber by introduction of gas.

Moreover, in order to achieve the above object, while plasma is formed in the processing chamber above the sample stage, the plurality of pins are driven and when the upper ends of the plurality of pins are moved above the upper surface of the sample stage, the gas is fed into the processing chamber.

In addition, in order to achieve the above object, the plasma processing apparatus comprises bellows disposed under the openings to cover around lower part of the pin and be extended and contracted with vertical movement of the pin, and space in the bellows is filled with the gas fed from the gas supply ports.

Moreover, in order to achieve the above object, the plasma processing apparatus comprises two upper and lower pipe members disposed in the bellows to cover around lower part of the pin. The lower pipe member thereof is moved up and down with movement of the pin and at least part of the lower pipe member overlaps the upper pipe member through gap to cover the pin doubly when the pin is housed in the sample stage.

Further, in order to achieve the above object, the plasma processing apparatus comprises sealing member to seal space in the bellows from outside airtightly, and the space in the bellows is filled with the gas.

Other objects, features and advantages of the invention will become apparent from the following description of the embodiments of the invention taken in conjunction with the accompanying drawings.

DESCRIPTION OF THE EMBODIMENTS

Embodiments of the present invention are now described with reference to the accompanying drawings.

Figure 1:
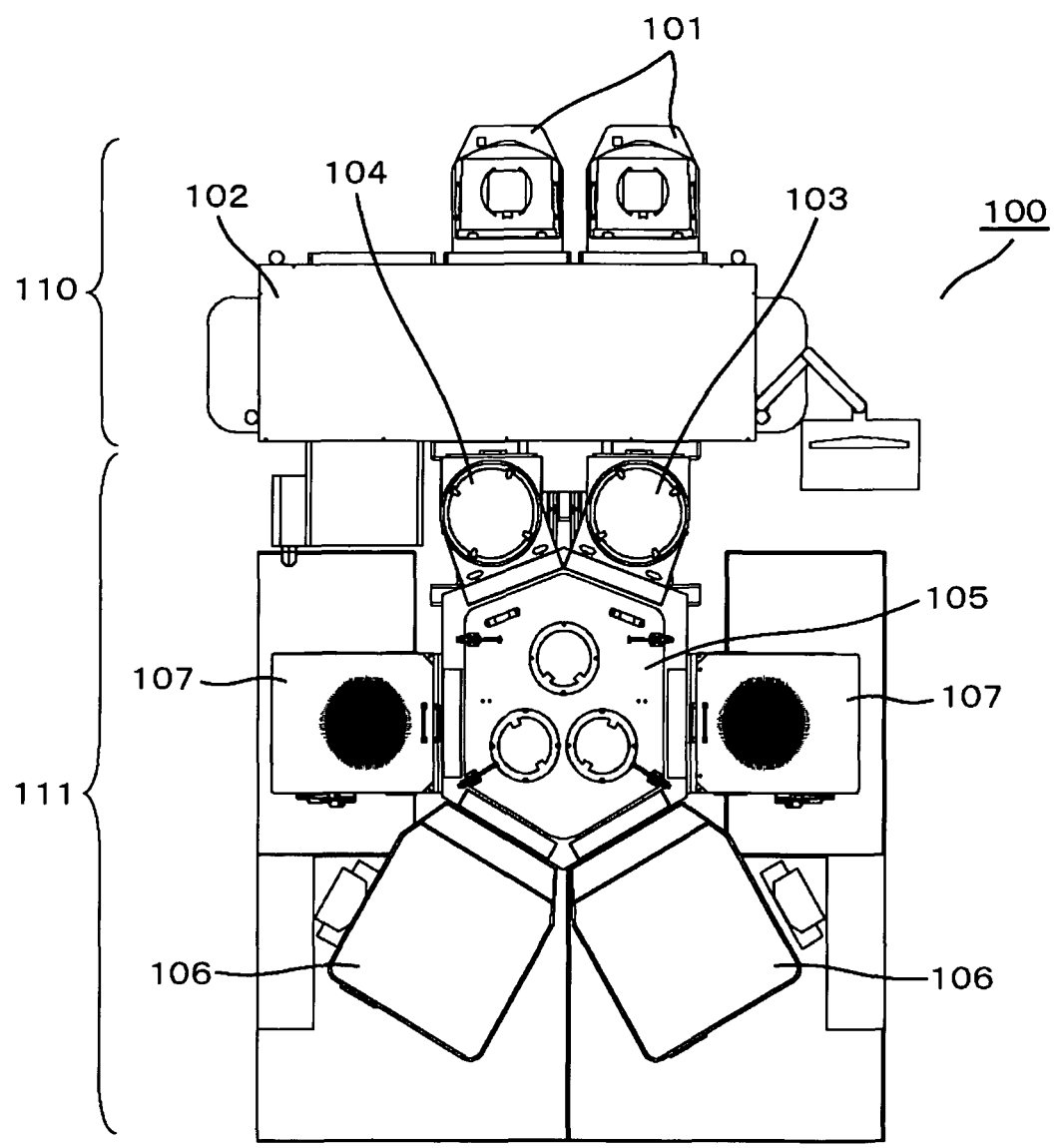
FIG. 1 is an top view schematically illustrating the whole structure of a vacuum processing apparatus according to an embodiment of the present invention.

FIG. 1 is a top view schematically illustrating the whole structure of a vacuum processing apparatus according to an embodiment of the present invention. In FIG. 1, the vacuum processing apparatus 100 includes an atmosphere block 110 disposed on the front side shown on the upper side of the drawing and a vacuum block 111 disposed on the rear side shown on the lower side of the drawing and connected or coupled with the rear side of the atmosphere block 110.

The atmosphere block 110 is a place where a sample on a substrate such as a semiconductor wafer is handled under the atmospheric pressure and includes a plurality of cassette pedestals 101 disposed in parallel with each other in the horizontal direction on the front side of the apparatus and on which sample housing cassettes are placed and an atmosphere-side sample carrying chamber 102 formed into a rectangular parallelepiped and having the front side thereof coupled with or attached to the cassette pedestals 101. The atmosphere-side sample carrying chamber 102 includes space in which the sample is carried under the atmospheric pressure and a carrying robot constituting means for carrying the sample is disposed.

The vacuum block 111 is disposed on the rear side of the atmosphere-side sample carrying chamber 102 of the atmosphere block 110. Lock chambers 103 and 104 constituting the vacuum chamber 111 are coupled with the rear side of the atmosphere-side sample carrying chamber 102. The lock chambers 103 and 104 are coupled with a vacuum-side sample carrying chamber 105 at the rear side thereof shown on the lower side of the drawing.

The vacuum-side sample carrying chamber 105 is constituted by a vacuum chamber having a polygonal shape (hexagon in the embodiment) in ground plan and having a plurality of side wall surfaces corresponding to sides thereof with which the lock chambers 103 and 104 and a plurality of vacuum processing units 106 and 107 are coupled. The lock chambers 103 and 104 are coupled with the rear side of the atmosphere-side sample carrying chamber 102 of the atmosphere block 110, so that the plurality of vacuum processing units 106 and 107 of the vacuum block 111 are coupled with the atmosphere-side sample carrying chamber 102 and the sample housing cassettes of the atmosphere block 110.

The lock chambers 103 and 104 are coupled with a vacuum exhaust apparatus not shown and internal pressure in the lock chambers can be adjusted between the atmospheric pressure and pressure of high vacuum degree in the vacuum-side sample carrying chamber 105. Gate valves are disposed before and behind the lock chambers to be integrally coupled therewith so as to open the lock chambers and close the lock chambers airtightly. Sample stage not shown having an upper surface above which the sample is placed is disposed in chamber in which pressure in the lock chambers 103 and 104 can be adjusted, so that the pressure can be changed in the state that the sample is placed on the sample stage and held. In the embodiment, the lock chambers 103 and 104 can house therein the sample in any of load side where sample unprocessed by the vacuum processing unit 106 or 107 is housed and unload side where processed sample is housed.

Moreover, gate valves (not shown) are disposed between carrying chamber in the vacuum-side sample carrying chamber 105 and the vacuum processing units 106, 107 to open and airtightly close passages for communicating therebetween to carry the sample. The gate valves are opened when sample is carried and closed to close between the inside of the vacuum processing units 106, 107 and the inside of the carrying chamber to airtightly seal processing chambers in the vacuum processing units 106, 107 when sample is processed.

In the above-mentioned vacuum processing apparatus 100, the sample grounded to the cassette pedestal 101 and housed in the sample housing cassette coupled with the atmosphere-side sample carrying chamber 102 is carried to the lock chamber 103 or 104 one by one by means of the carrying robot housed in the vacuum-side sample carrying chamber 102. After the sample is housed in housing chamber in the lock chamber 103 or 104 being in the atmosphere state and placed on the sample stage, the gate valve on the side of the atmosphere-side sample carrying chamber 102 is closed to decompress the inside of the lock chamber 103 or 104.

After the inside of the lock chamber 103 or 104 reaches the pressure having the same vacuum degree as that of the inside of the vacuum-side sample carrying chamber 105, the gate valve on the side of the vacuum-side sample carrying chamber 105 is opened and the sample is taken out by the carrying robot housed in the vacuum-side sample carrying chamber 105 to be carried to any of the vacuum processing units 106 and 107 and the surface of the sample is subjected to processing in the unit. After completion of the processing, the sample is carried to another processing unit or any of the lock chambers 103 and 104 through the vacuum-side sample carrying chamber 105 by means of the carrying robot.

The inside of the lock chamber 103 or 104 to which the sample has been carried is in the vacuum state and after the sample which has been processed is housed, the gate valve equipped therewith is closed to seal the chamber airtightly, so that the inside thereof is pressurized and the pressure thereof is increased to the atmospheric pressure. After it is confirmed that the pressure in the chamber reaches the same pressure as that of the inside of the atmosphere-side sample carrying chamber 102, the gate value on the side of the atmosphere-side sample carrying chamber 102 is opened and the sample is returned to the original position of the original cassette by the carrying robot disposed therein.

Figure 2:
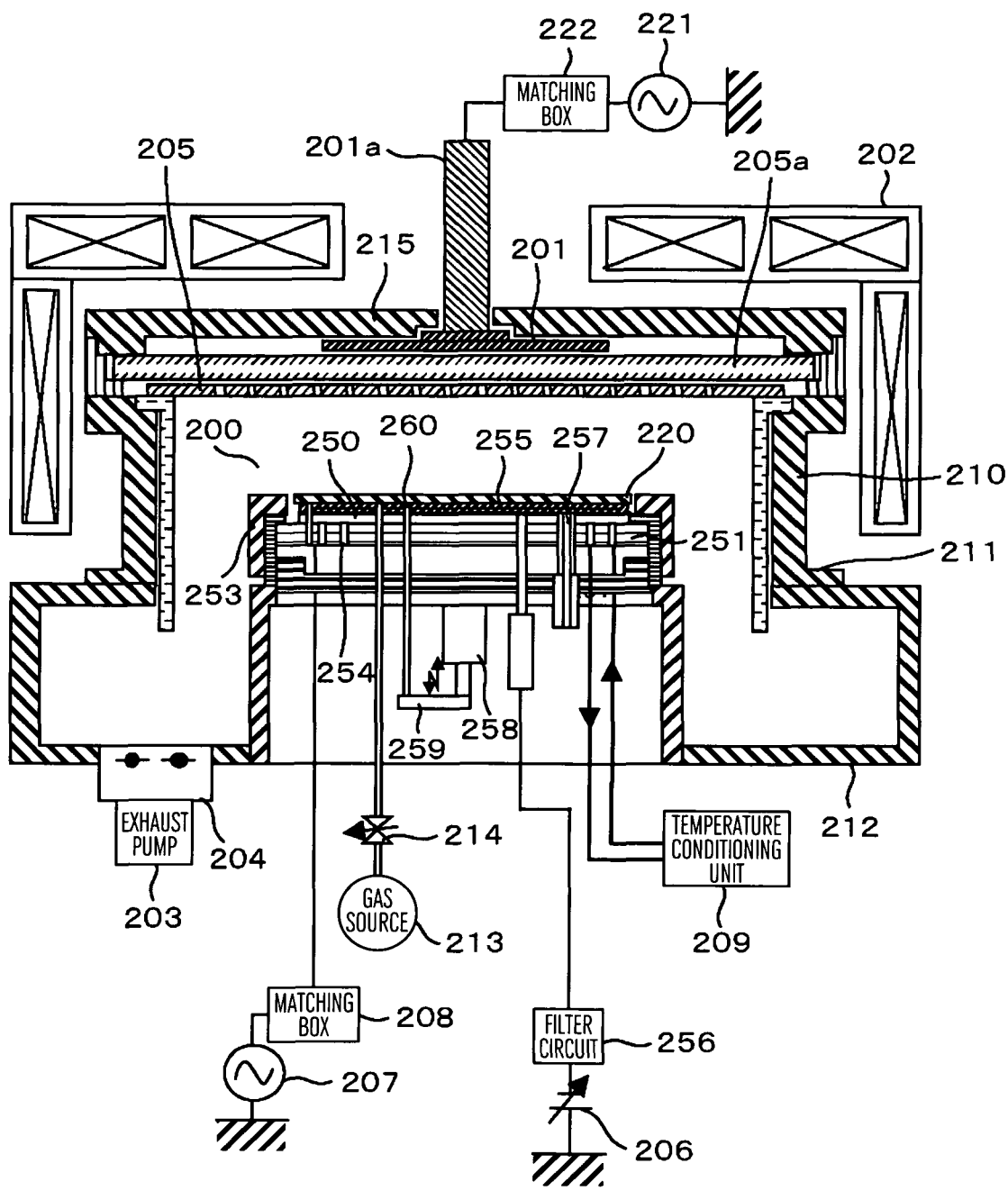
FIG. 2 is a longitudinal sectional view schematically illustrating the structure of the vacuum processing unit according to the embodiment shown in FIG. 1.

Referring now to FIG. 2, the vacuum processing unit is described. FIG. 2 is a longitudinal sectional view schematically illustrating the vacuum processing unit according to the embodiment shown in FIG. 1.

Particularly, FIG. 2 schematically illustrates an etching processing unit which is one of the vacuum processing unit 106. In the embodiment, the vacuum units 106 and 107 are provided two each as the processing units for processing the sample and the vacuum processing units 106 are processing units for etching which are coupled with two adjacent side wall surfaces on the rear side of the vacuum-side sample carrying chamber 105. On the other hand, the vacuum processing units 107 are processing units for ashing which are coupled with two opposite side wall surfaces on right and left sides of the vacuum-side sample carrying chamber 105 as viewed from the front side.

The vacuum processing unit 106 includes, divided broadly in the vertical direction, a processing vessel part disposed in upper part thereof and provided with a vacuum container, a generation device of electric field or magnetic field and an exhaust device and a bed part disposed in lower part and formed into a rectangular parallelepiped housing therein a controller for adjusting supply of electric power, gas and fluid such as cooling refrigerant to the processing vessel part.

FIG. 2 schematically illustrates a primary part of the vacuum processing unit 106 in which the vessel part disposed in upper part of the vacuum processing unit 106 is enlarged. In FIG. 2, a processing chamber 200 is disposed in a vacuum container 210 constituting the vessel part and a disk-shaped antenna 201 is disposed above the processing chamber 200 to emit radio waves into the processing chamber 200 to supply electric field. A sample stage 250 is disposed in lower part and the board-shaped sample to be processed such as wafer 220 is placed on the upper surface of the sample stage 250.

The vacuum container 210 includes a lid member 215 thereof disposed above the antenna 201, a substantially cylindrical side wall 211 which covers the outer periphery of the processing chamber 200 and a lower container 212 disposed under the side wall 211. The side wall 211 and the lower container 212 are disposed to enclose the outer periphery of the sample stage 250 through space. The space disposed therebetween constitutes space for moving gas, plasma and reaction products in the processing chamber 200 downward by operation of an exhaust pump 203 constituting an exhaust device coupled with the lower container at lower part thereof and exhausting them from an opening disposed in lower part of the lower container 212.

A magnetic field forming device 202 composed of, for example, electromagnetic coils and yokes is disposed out of the side wall 211 surrounding the outer periphery of the processing chamber 200 and the lid member 215 to enclose the side wall 211 and the lid member 215. Plasma is formed in the processing chamber 200 by magnetic field supplied by the magnetic field forming device 202 and electric field supplied by the antenna 201 to the processing chamber 200.

A disk-shaped shower plate 205 constituting a ceiling surface of the processing chamber 200 is disposed above the sample stage 250 of the processing chamber 200 opposite to the upper surface of the sample stage 250. A disk-shaped window member 205a made of dielectric material such as quartz is disposed between the shower plate 205 and the lid member 215 above the shower plate 205 and is coupled with the upper end of the side wall 211 to seal the processing chamber 200 airtightly.

Gap is formed between the shower plate 205 and the window member 205a to dispose space therebetween and processing gas which is a mixture of a plurality of kinds of substances is fed from gas feeding means not shown thereinto at predetermined flow rate and mixture ratio to fill the space with the processing gas. A plurality of penetration holes having minute diameter and communicating with the space are formed in part of the shower plate 205 which is disposed above the upper surface of the sample stage 250 on which the sample is placed and parallel with and opposite to the upper surface of the sample stage 250 and the processing gas filling the space is introduced from the penetration holes into space over the sample stage 250 in the processing chamber 200 during processing of the sample. On the other hand, a vacuum exhaust valve 204 having a plurality of rotatable flaps capable of being opened and closed to enable and inhibit communication is disposed between opening at lower part of the vacuum container 210 and inlet of the exhaust pump 203 below the opening of the vacuum container 210 and pressure in the processing chamber 200 is controlled by cooperation operation of the vacuum exhaust valve 204 with the exhaust pump 203 while the inside of the processing chamber 200 is not opened to the atmosphere during processing or carrying of the sample and is kept to vacuum pressure.

When the sample is processed, the antenna 201 is applied with high-frequency electric power through a high-frequency power supply 221 and a matching box 222 installed out of the vacuum container 210 and a coaxial cable 201a connected to the matching box 222, so that high-frequency electric field is introduced into the processing chamber 200 through the antenna 201. Moreover, simultaneously, magnetic field formed by the magnetic field forming device 202 is supplied into the processing chamber 200, so that atoms and molecules of substances of the processing gas are excited by interaction of the electric field and the magnetic field to form plasma and the plasma is used to etch the wafer 220.

The sample stage 250 is formed into a substantially cylindrical shape and includes a disk-shaped metal block 251 disposed in the sample stage 250 and having high heat transmission characteristic, a dielectric film 255 made of mixed material containing mainly alumina and yttria disposed to cover the upper surface of the disk-shaped metal block and a filmy electrode 257 disposed in the dielectric film 255 and electrically connected to a DC power supply 206 through a filter circuit 256. Moreover, in order to electrically insulate an external peripheral part of a disk-shaped placement surface covered by the dielectric film 255 and on which the wafer 220 is placed and the side wall of the metal block 251 from plasma securely and in order to protect them from being dissipated or worn off by sputtering and etching by plasma, a ceramic cover 253 is disposed to cover the upper surface of the external periphery part of the placement surface and the side wall of the metal block 251.

Moreover, a flow path 254 is disposed concentrically or spirally in the metal block 251 constituting the sample stage 250 and refrigerant having temperature or flow rate (velocity) adjusted by a temperature conditioning unit 209 installed out of the vacuum chamber 210 is introduced into the flow path, so that temperature of the metal block 251 and hence the sample stage 250 is adjusted. The wafer 220 put on the upper surface of the sample stage 250 receives heat input from plasma during processing, although the temperature of the wafer 220 put on the upper surface of the sample stage 250 is controlled by adjusting the temperature of the sample stage 250.

In order to improve heat conduction between the wafer 220 and the sample stage 250 or metal block 251, a plurality of openings communicating with a gas source 213 of, for example, helium (He) gas having the heat transmission characteristic through a gas supply adjustment valve 214 are disposed in the upper surface of the dielectric film 255, so that helium gas is fed into the space between the rear side of the wafer 220 and the dielectric film 255 while the wafer 220 is placed on the placement surface. Heat supplied to the wafer 220 by the helium gas is transmitted to the dielectric film 255 and the metal block 251 to thereby cool the wafer 220.

A metal plate member is disposed under the metal block 251 through an insulating member to airtightly seal the processing chamber 200 from the outside thereof. Furthermore, an actuator 258, an arm 259 connected to the actuator 258 and a plurality (3 in the embodiment) of rod-shaped pusher pins 260 coupled with an end of the arm 259 and extending in the vertical direction are disposed under the metal plate member. The pusher pins 260 are disposed within a passage penetrating the metal block 251 constituting the sample stage 250, the dielectric film 255, the insulating member and the plate member so that the axes thereof are disposed in parallel with the axial direction of the passage. The pusher pins are disposed symmetrically to the center of the wafer 220 and within the range of 60 to 80% of the radius of the wafer 220 so as to prevent the wafer 220 from being broken and damaged by nonuniform external force.

The vertical direction of the driving operation of the actuator 258 is parallel to or substantially parallel to the axis and the pusher pins 260 coupled with the arm are moved up and down in interlocked relationship with the operation of the actuator 258. Such movement is performed upon delivery of the wafer 220 in the processing chamber 200 before and after processing as described later.

In the vacuum processing unit 106 as structured above, the wafer 220 to be subjected to predetermined processing is placed onto the carrying robot from the lock chamber 103 or 104 to be taken out and is carried into the processing chamber 200 in the vacuum processing unit (for example, 106) in which the processing is performed. Next, when the wafer 220 reaches the upper part of the placement surface of the sample stage 250 while the wafer 220 is placed on the robot, operation of the robot is stopped so that the wafer 220 is held to be in the upper part of the placement surface.

The actuator 258 is driven to move the pusher pins 260 upward and upper ends of the pusher pins 260 rise from opening of the dielectric film 255 upward. Furthermore, the pusher pins abut against the rear side of the wafer 220 and the wafer 220 is put on the upper ends of the pusher pins. The upper parts of the pusher pins 260 rise above the robot until the wafer is lifted up from the robot and are held at predetermined position of the upper ends. After this state is maintained and the robot is evacuated out of the processing chamber 200, the pusher pins 260 are moved down by operation of the actuator 258 and the rear side of the wafer 220 comes into contact with the placement surface. Then, the pusher pins are moved down to lower end position through the passage.

Next, DC voltage is applied to the electrode 257 by means of the DC power supply 206 and the filter circuit 256 installed out of the processing chamber 200 to electrostatically absorb the wafer 220 put on the placement surface through the dielectric film 255. In the embodiment, the electrode 257 has a so-called bipolar type structure composed of a plurality of films having different polarities. Furthermore, after it is confirmed that the robot is moved out of the vacuum processing unit 106, the gate valve between the processing chamber 200 and the vacuum-side sample carrying chamber 105 is closed to seal the processing chamber airtightly.

In this state, helium (He) gas is supplied from the gas source 213 installed out of the processing chamber 200 through the gas supply adjustment valve 214 for adjusting a supply amount of gas and opening disposed in the upper surface of the dielectric film 255 into space between the rear surface of the wafer 220 and the upper surface of the dielectric film 255 to cool the wafer 220.

The processing gas is fed from the penetration holes of the shower plate 205 into the processing chamber 200 and is plasmized by the electric field and the magnetic field supplied by the antenna 201 and the magnetic field forming device 202, respectively, so that plasma is formed above the wafer 220. Further, high-frequency electric power is applied from an RF bias power supply 207 installed out of the processing chamber 200 to the metal block 251 constituting the sample stage 250 through a matching box 208 and ions in plasma are taken in above the wafer 220 by potential difference between plasma potential and bias potential by RF bias formed above the upper surface of the wafer 220, so that processing is started while assisting etching reaction.

After completion of the processing, plasma and RF bias are stopped and supply of DC voltage to the electrode 257 is also stopped to make reduction and removal of electrostatic power. In this state, the actuator 258 is driven again and the pusher pins 260 rise within the passage, so that the upper ends of the pusher pins abut against the rear side of the wafer 220 and are further moved above the dielectric film 255 so that the wafer 220 is lifted up above the sample stage 250 and is moved to the upper end position of the pusher pins 260.

Then, after the gate valve between the processing chamber 200 and the vacuum-side sample carrying chamber 105 is opened and the robot is moved to the lower part of the wafer in the processing chamber 200 to be stopped, the pusher pins 260 are moved to the lower part of the robot by operation of the actuator 258 and the wafer is delivered to the robot. The robot is evacuated out of the processing chamber 200, so that the wafer 220 is carried out of the processing chamber 200. Thereafter, the wafer 220 is carried to any of another vacuum processing unit or the lock chamber 103 or 104 by the robot and another unprocessed wafer 220 is carried to the processing chamber 200 from which the wafer is carried out by the robot.

Moreover, in order to perform cleaning and exchange of atmosphere in the processing chamber 200 in the vacuum container 210, it is considered that plasma is formed in the processing chamber 200 when the wafer 220 is not placed on the sample stage 250. For example, in the etching processing performed to form the gate structure, it is considered that cleaning using fluorine gas such as $SF_6$ and $CF_4$ or $O_2$ (oxygen) for formation of plasma is performed. Furthermore, it is considered that gas containing $CL_2$ (chlorine), HBr (hydrogen bromide) and another active gas having characteristics similar in actual processing condition abundantly is used for exchange of atmosphere to form plasma.

When formation of plasma using such gas is repeated, active gas comes into the outer periphery of the pusher pins 260 although the pusher pins are housed in the sample stage 250, for example, and the gas is further plasmized, so that it is apprehended that deposits and etching are advanced to produce contaminations or alien substances. Accordingly, in order to reduce and eliminate such a bad influence, inert gas such as, for example, He, Ar and Xe can be introduced into space around the pusher pins while plasma is formed as above.

Figure 3:
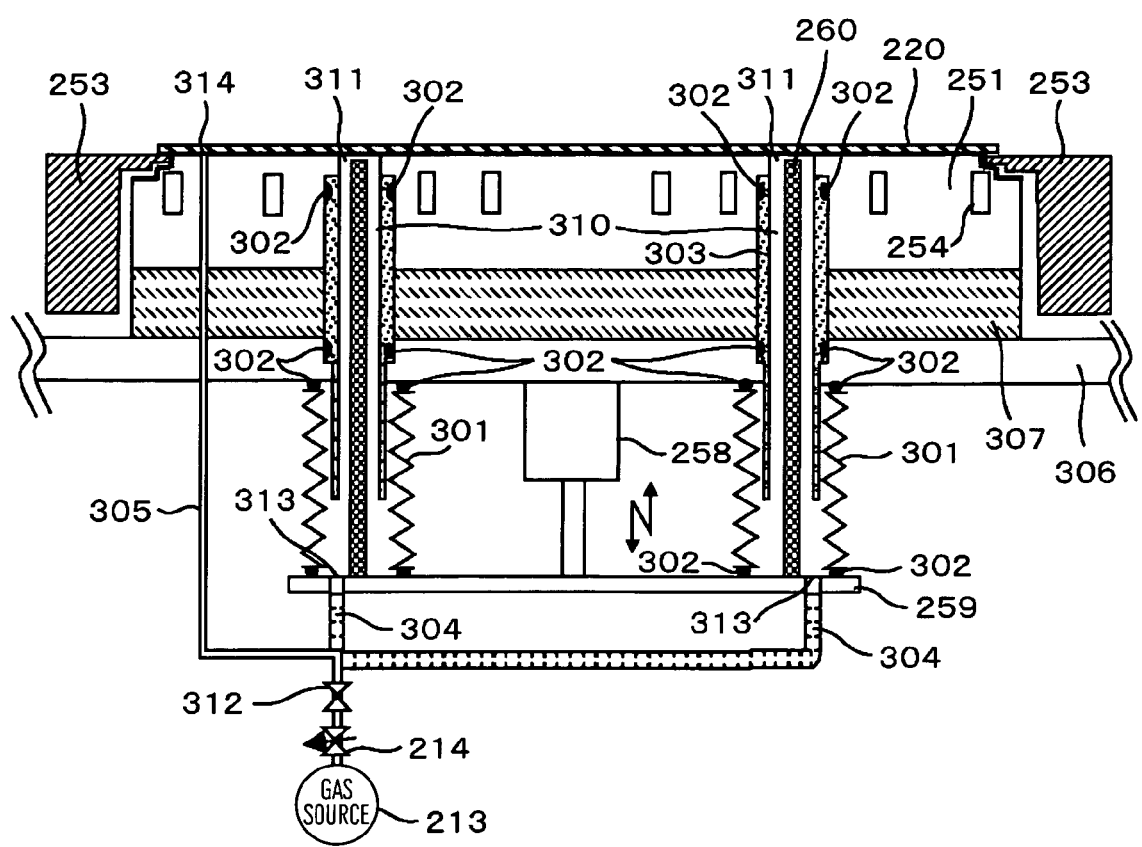
FIG. 3 is a longitudinal sectional view schematically illustrating the structure of a primary part of a sample stage according to the embodiment shown in FIG. 2.

The embodiment of the present invention is now described in further detail with reference to FIGS. 3, 4 and 5. FIG. 3 is a longitudinal sectional view schematically illustrating the structure of a primary part of the sample stage according to the embodiment shown in FIG. 2. In the embodiment, particularly, the pusher pins 260 are described in detail.

As shown in FIG. 3, a plurality (3 in the embodiment) of penetration holes 310 constituting vertical holes for moving the pusher pins 260 therethrough are formed in the metal block 251 to penetrate it. Moreover, an insulating plate 307 and a metal base plate 306 are disposed under the metal block 251 so that the processing chamber 200 is sealed airtightly from the outside thereof. In the embodiment, the penetration holes 310 are formed to penetrate the insulating plate 307 and the metal base plate 306.

Since the metal block 251 is applied with high-frequency electric power to form RF bias, the insulating plate 307 electrically insulates between the metal base plate 306 and the metal block 251. The upper part positioned higher than the metal base plate 306 belongs to the inside of the processing chamber 200 and is kept to be predetermined decompressed vacuum degree, whereas the lower part thereof forms high-pressure side space such as the atmosphere. The metal base plate 306 constitutes part of the vacuum container 210.

In the embodiment, a lower end of a vertically movable operation part of the actuator 258 is coupled to the center part of the arm 259 and ends of the arm 259 are connected to lower ends of the pusher pins 260. The pusher pin 260 is formed into a rod having an upper end extending toward the placement surface covered by the dielectric film 255 and constituting the upper surface of the sample stage 250 and when the actuator 258 is positioned at its lower end position, the upper ends of the pusher pins 260 are kept housed in the penetration holes 310.

The pusher pins 260 are moved upward within the penetration holes 310 constituting the passages by operation of the actuator 258 and the upper ends thereof can pass over openings 311 communicating with space within the penetration holes 310 in the upper surface of the dielectric film 255 and be further moved up. In this manner, the pusher pins 260 are moved up and down in the penetration holes 310 in interlocked relationship with the vertical movement of the actuator 258 to place and detach the wafer 220, so that delivery of the wafer 220 between the robot and the sample stage is performed. In the embodiment, the pusher pins 260 are disposed in the penetration holes 310 to have predetermined space between the inner wall surfaces of the penetration holes 310 and the pusher pins and to have axial direction thereof disposed in the penetration holes with predetermined accuracy so as to prevent the pusher pins 260 from coming into contact with or being slidably moved on the inner wall surfaces of the penetration holes 310.

The lower end part of the pusher pins 260 are covered by metal bellows flanges 301 formed into bellows and capable of being extended and contracted in the vertical direction. The bellows flanges 301 have the upper end coupled with the lower surface of the metal base plate 306 and the lower end coupled with the upper surface of the arm 259. O-rings 302 are disposed between the upper end of he bellows flanges 301 and the lower surface of the metal base plate 306, and between the lower end of the bellows flanges 301 and the upper surface of the arm 259 to seal the inside of the bellows flange 301 from the outside airtightly. Thus, the space in the bellows flanges 301 communicating with the processing chamber 200 through the space in the penetration paths 310 and the openings 311 disposed in the upper surface of the dielectric film 255 is decompressed and sealed airtightly.

The inner wall of the penetration paths 310 of the embodiment is formed by an insulating boss 303 positioned in the metal block 251 and penetrating the insulating plate 307 and the metal base plate 306. Outer peripheral part of the boss 303 is sealed by means of O-rings 302 surrounding the outer peripheries of an upper end of the boss positioned in the metal block 251 and a lower end of the boss penetrating the metal base plate 306 and abutting thereagainst to suppress gas having high reactivity from going into the outer peripheral part of the boss and the inside of the inner peripheral wall of the penetration path 310 is formed into isolated space.

The lower end of the boss 303 is further extended downward from the lower surface of the metal base plate 306 inside the bellows flange 301 so that gas in the processing chamber 200 entering the inside of the penetration hole 310 is suppressed from moving downward to go into the inside of the bellows flange 301. On the other hand, the boss 303 is formed to have predetermined length so that a predetermined gap or space is formed between the lower end of the boss 303 and the upper surface of the arm 259 at the time that the arm 259 is moved to its upper end position by operation of the actuator 258.

In the embodiment, an opening 313 is formed in part of the arm 259 sectioned by the bellows flange 301 and facing on or exposed to internal space defined by the bellows flange 301 so that helium (He) gas from the gas source 213 is fed from the opening 313 into the internal space through a route of the gas supply adjustment valve 214 and a valve 312. The route branches between the valve 312 and the opening 313 into a route communicating with the opening 313 exposed to the internal space of the bellows flange 301 and a route communicating with an opening 314 for helium gas formed in the upper surface of the dielectric film 255. The routes are formed of a flexible tube 304 and a pipe 305 having at least part which can extend and contract in response to vertical operation of the arm 259.

When the wafer 220 is put on the placement surface, helium gas is introduced through the above routes into the rear surface of the wafer 220 and space separated by the bellows flanges 301 around the pusher pins 260. Since the pusher pins 260 have the function of placing and separating off the wafer 220, 3 or 4 pusher pins are usually required but the number of pusher pins may be more. In the drawings, two pusher pins are shown for simplification.

When the wafer 220 is put on the placement surface of the sample stage 250, helium gas is fed into space between the rear surface of the wafer 220 and the upper surface of the dielectric film 255 from both of the pipe 305 and the route formed of the flexible tube 304, the bellows flange 301 surrounding the pusher pin 260 and the space in the penetration hole 310. Moreover, when the wafer 220 is not put on the placement surface, helium gas can be also fed to these routes.

At this time, the openings 311 are exposed to the space in the processing chamber 200, so that the space in the processing chamber 200 communicates with the spaces in the penetration holes 310 and in the bellows flanges 301. In such state, helium gas fed from the gas source 213 blows into the processing chamber 200 above the sample stage 250 through the flexible tube 304 or the pipe 305.

The gas supply adjustment valve 214 and the valve 312 are disposed in a helium gas supply path between the gas source 213 and the flexible tube 304 or the pipe 305. The valves 214 and 312 serve to adjust supply of helium gas from the gas source 213 and the gas supply adjustment valve 214 is a device for variably adjusting the opening of the path and is to adjust a flow rate (velocity) of helium gas to a desired value designated by the user. The valve 312 has the function of closing and opening the path in accordance with operation command and turning on and off the supply of helium gas. Helium gas having the adjusted supply amount is introduced from the gas source 213 into the bellows flanges 301 through the openings 313 constituting supply ports.

When the wafer 220 is put on the placement surface of the sample stage 250 and is absorbed to be held, helium gas is fed from the gas source 213 into space between the rear surface of the wafer 220 and the upper surface of the dielectric film 255 constituting the placement surface, so that heat transmission between the wafer 220 and the sample stage 250 can be improved to make value or distribution of temperature of the wafer 220 approach desired temperature. In order to improve the heat transmission, opening and closing of the valve 312 are adjusted in accordance with pressure of helium gas in the path detected by a sensor not shown, so that the pressure of helium gas is maintained within the range of desired value.

In other words, when it is judged that the pressure value detected by the sensor is not lower than a predetermined value, the valve 312 is closed. However, the space between the wafer 220 and the placement surface which generally absorb each other is not perfectly sealed by the placement surface abutting against the wafer 220 by absorption, so that a small amount of helium gas leaks into the processing chamber 200 from the gap between the wafer and the placement surface, for example, the gap between ring-like part of outer peripheral edge of the placement surface and the rear surface of the wafer 220.

Accordingly, when the valve 312 is closed, the pressure of helium gas is reduced gradually and when it is judged that the pressure of helium gas is equal to or lower than predetermined value, the valve 312 is opened and kept being opened to feed helium gas into the space from the opening 311 or 314, so that the pressure is increased. When it is judged that the pressure detected by the sensor is equal to or higher than predetermined value, the valve 312 is closed again.

In the above adjustment, the pressure of helium gas in the space between the rear surface of the wafer 220 and the dielectric film 255 and the pressure in the penetration holes 310 and the space within the bellows flanges 301 or the pressure in the pipe 305 communicating with the opening 314 are regarded as identical. The gas supply adjustment valve 214 can be fixed to a specific opening (for example, fully-opened state) and operation of only the valve 312 can be adjusted.

On the other hand, when absorption between the wafer 220 and the placement surface of the sample stage is released, the flow rate (velocity) of helium gas is adjusted. In this case, the valve 312 is kept being opened and the opening of the valve is adjusted in accordance with output detected in the gas supply adjustment valve 214, so that the flow rate (velocity) of helium gas is adjusted to fall in a predetermined range. The opening of the gas supply adjustment valve 214 is adjusted so that helium gas can flow into the processing chamber 200 from the opening 311. In this case, the pressure in the space defined by the penetration holes 310 and the bellows flanges 301 to be sealed is set to be higher than the pressure in the processing chamber 200, so that helium gas is fed from the space into the processing chamber 200.

Such supply of helium gas reduces temperature of the wafer 220 held on the placement surface from being different locally and particularly temperature inside the openings 311 of the penetration holes 310 through which the pusher pins 260 are moved up and down from being different locally so that distribution of temperature is nonuniform. Furthermore, helium gas is fed into the processing chamber in the state that the wafer 220 is released from being held on the placement surface, particularly in the state that the opening 311 is exposed to the inside of the processing chamber 200, so that it is suppressed that gas having reactivity and particles of products having adhesivity go into the space defined by the penetration holes 310 and the bellows flanges 301 from the processing chamber 200 to react to the pusher pins 260 and the inner walls of the boss 303 and the bellows flanges 301 and adhere the products thereto and the products are peeled off due to the extension and contraction of the bellows flanges to produce contaminations or alien substances.

Supply of helium gas into the rear surface of the wafer 220 and supply of helium gas into the circumference of the pusher pins 260 may be made by means of different routes of gas supply means. In this case, when the wafer 220 is put on the placement surface, the pressure or the flow rate of helium gas supplied to the circumference of the pusher pins can be adjusted independent of that of helium gas supplied to the rear surface of the wafer 220, so that temperature control knob at the opening 311 around the upper end of the pusher pins 260 can be expanded.

Helium gas may be fed into the pusher part from the side wall of the boss 303 in the metal base plate 306. In this case, the flexible tube 304 is not required. Generally, the flexible tube is expensive and accordingly reduction in cost can be expected.

In the embodiment, there is shown the internal sealing structure using the bellows flanges 301 and the O-rings 302 in order to absorb the vertical movement of the actuator 258, although another structure may be adopted as far as it is a sealing structure having no sliding part. Further, the pusher pins may be disposed out of the diameter of the wafer 220, that is, the outside in the radial direction from the outer edge of the wafer 220. In this case, when electric discharge is produced to form plasma in the state that the wafer 220 is put on the placement surface, supply of helium gas to the penetration holes 310 constituting the passage of the pusher pins 260 may be stopped.

The boss 303 of the embodiment is made of insulator such as fluorine resin, polyimide and ceramics and is formed into the integral structure, although it may be structured by a plurality of members. For example, an extension part of the boss obstructing between the inner surface of the bellows flange 301 and the lower side wall of the pusher pin 260 may be structured as another member combined with the upper part and may be made of metal except insulation. In this case, it is desired to have oxide film such as, for example, aluminum alumite, which does not become a metal contamination source.

The actuator may be any driving means including air drive type and electric drive type but desirably makes driving smooth without vibration. The arm 259 is preferably made of material having strong rigidity excluding material forming a contamination source. For example, it may be resin or ceramics having high rigidity. Material of the pusher pin 260 is preferably excellent in static elimination characteristic and plasma-resistant characteristic. Moreover, instead of the structure in which the wafer 220 is absorbed to be fixed in the embodiment, any of electrostatic absorption device of monopole type and mechanical holding device may be used.

Figure 4:
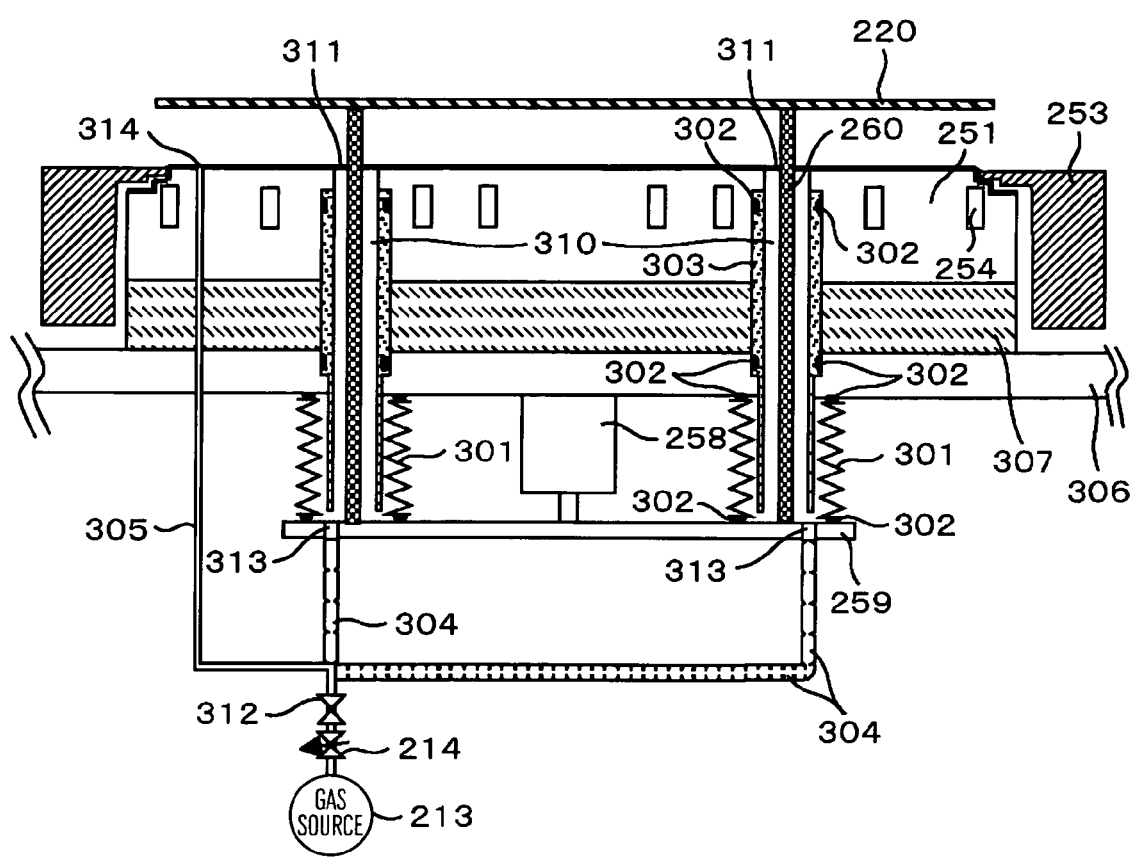
FIG. 4 is a longitudinal sectional view schematically illustrating the state that pusher pins lift up a wafer in the sample stage of the embodiment shown in FIG. 3.

Referring now to FIG. 4, there is described operation of lifting the wafer 220 by the pusher pins 260 to deliver it between the robot and the sample stage in the embodiment. FIG. 4 is a longitudinal sectional view schematically illustrating the state that the pusher pins 260 lift the wafer 220 in the sample stage 250 in the embodiment shown in FIG. 3.

Such state occurs in case where the wafer is delivered between the sample stage and the robot before and after processing. After electric power supplied to absorb the wafer 220 by static electricity is stopped and predetermined time elapses in the state that the wafer 220 is put on the placement surface constituted by the dielectric film 255, a command is issued to the actuator 258 and the actuator is operated, so that the arm 259 is driven to be moved up.

After the pusher pins 260 coupled with end in the horizontal direction of the arm 259 are moved up in the penetration holes 310 and the upper ends of the pusher pins 260 abut against the rear surface of the wafer 220, the arm 259 is further moved up so that the pusher pins 260 push up the wafer 220 to thereby separate the wafer 220 from the upper surface of the dielectric film 255, so that the wafer 220 is separated from the sample stage 250. Even after the wafer 220 is separated from the sample stage 250, the arm 259 is driven to move up the pusher pins 260 until space into which the robot can enter under the wafer 220 is formed and the robot reaches the upper end position of the arm 259 or the pusher pins 260 to be fixed at its position.

At the upper end position, a predetermined gap is formed between lower end of cylindrical extension part constituting the lower part of the boss 303 and extending downward from the lower surface of the metal base plate 306 and the upper surface of the arm 259 to prevent them from coming into contact with each other. Furthermore, a gap is also formed between inner side of the contracted bellows flange 301 and outer peripheral wall of the cylindrical extension part to suppress them from coming into contact with each other. Thus, the inner surface of the bellows flange 301 is mostly covered by the cylindrical extension part. The above structure suppresses gas, broken pieces of products and particles entering from the openings 311 into the penetration holes 310 from reaching the inner surfaces of the bellows flanges 301.

Moreover, when the arm 259 or the pusher pins 260 are moved up and it is detected by a position sensor not shown that the upper ends of the pusher pins 260 rise upward from the openings 311, helium gas having the flow rate adjusted within a predetermined range is fed from the openings 313 into the sealed space in the bellows flanges 301 and the penetration holes 310 and further from the openings 311 exposed to the inside of the processing chamber 200 into the processing chamber 200. Furthermore, in the state that helium gas is introduced into the processing chamber 200, the robot goes under the wafer 220 and the arm 259 and the pusher pins 260 are moved down to extend the bellows flanges 301.

After the wafer 220 moving down with the movement of the pusher pins 260 comes into contact with the upper surface of the robot, the wafer 220 is delivered to the robot from the descending pusher pins 260. The pusher pins 260 are further moved down and the upper ends thereof go down lower than the openings 311 to be moved to the lower end position where the upper ends are housed within the penetration holes 310. The robot to which the wafer 220 has been delivered is moved out of the processing chamber 200 while the wafer 220 is held and carries it out.

The area in the inner surface of the bellows flange 301 which is not covered by the extension part is increased with the downward movement of the pusher pin 260 from the upper end position thereof, although the pressure of helium gas fed into the inside is higher than the pressure in the processing chamber 200, so that helium gas continuously flows upward into the penetration holes 310 to be flowed out of the openings 311. Thus, gas and products in the processing chamber 200 are suppressed from going into the penetration holes 310 from the openings 311 and broken pieces and particles peeled off from deposits stuck on the inner walls of the penetration holes 310 are suppressed from going into the lower part of the space in the bellows flanges 301 and from being stuck on the inner surfaces thereof.

Moreover, when the wafer 220 is carried in the processing chamber, the wafer 220 is not put on the placement surface of the sample stage 250. Further, in the state that the pusher pins 260 are housed in the penetration holes 310, helium gas is fed into the space within the bellows flanges 301 from the openings 313 while the flow rate thereof is adjusted and flows upward within the penetration holes 310, so that helium gas is introduced into the processing chamber 200 from the opening 311 facing the processing chamber 200.

In this state, the gate valve for opening and closing communication between the vacuum processing unit 106 and the vacuum-side sample carrying chamber 105 is opened and the wafer 220 put on the robot goes into the processing chamber 200. Then, the wafer 220 is carried to predetermined position above the placement surface of the sample stage 250 and operation of the robot is fixed to hold the position of the wafer 220. Thereafter, the arm 59 and the pusher pins 260 are driven to be moved up by operation of the actuator 258. In this case, helium gas is introduced from the openings 311 into the processing chamber 200.

The upper ends of the rising pusher pins 260 abut against the rear surface of the wafer 220 and the pusher pins 260 are further moved up to thereby lift up the wafer 220 above the robot, so that the wafer 220 is moved to the upper end position and stopped. Then, after the robot is moved from below the wafer 220 and evacuated out of the processing chamber 200, the pusher pins 260 are moved downward.

In the state that supply of helium gas from the opening 313 into the bellows flanges 301 before or during the down movement of the pusher pins 260 is stopped and helium gas is not introduced from the opening 311 into the processing chamber 200, the pusher pins 260 are housed in the penetration holes 310 and the wafer 220 is put on the placement surface of the sample stage 250. When it is detected that the wafer 220 is put on the placement surface and the pusher pins 260 reach the lower end position thereof, DC electric power is supplied to the electrode 257 in the dielectric film 255 shown in FIG. 2 from the DC power supply 206, so that the wafer 220 is absorbed onto the placement surface to be held.

When it is detected that electric power is supplied to the electrode 257 and the wafer 220 is absorbed onto the dielectric film 255, helium gas is fed through the openings 311 and 314 into space between the rear surface of the wafer 220 and the upper surface of the dielectric film 255 while the pressure thereof is adjusted to be within predetermined range by operation of the valve 312 similarly to the above. On the other hand, when the wafer 220 is held in the space above the dielectric film 255 or is being moved, the openings 311 are exposed to space in the processing chamber 200, although meanwhile helium gas is fed through the opening 311 into the processing chamber 200 while the flow rate (velocity) thereof is adjusted by operation of the gas supply adjustment valve 214.

Figure 7:
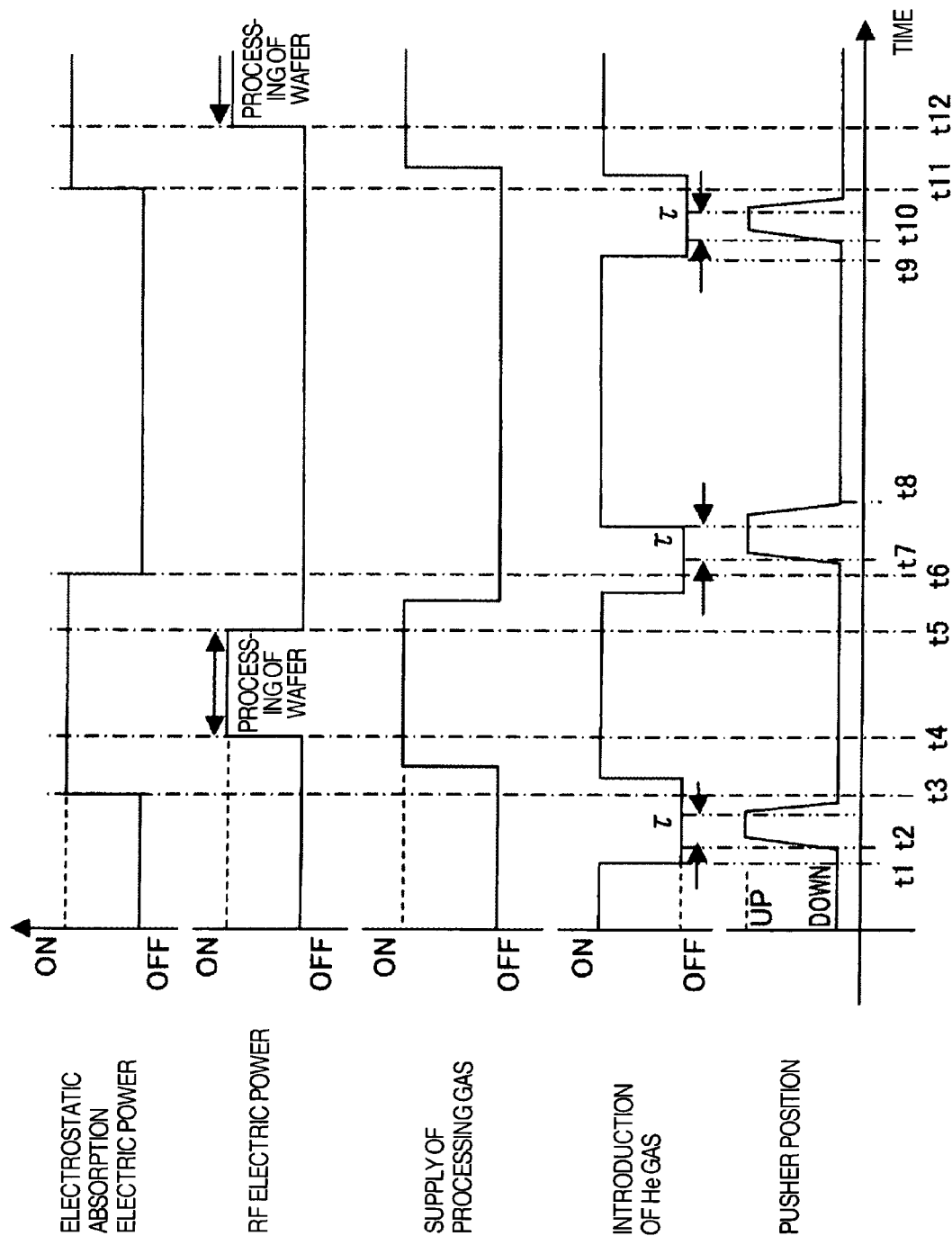
FIG. 7 is a timing chart showing wafer processing operation of the vacuum processing apparatus according to the embodiment shown in FIG. 1.

Referring now to FIG. 7, operation of introduction of helium gas and processing of the wafer 220 is described. FIG. 7 is a timing chart showing wafer processing operation of the vacuum processing apparatus according to the embodiment.

FIG. 7 shows states of "electrostatic absorption electric power" supplied to the electrode 257 from the DC power supply 206, on and off of "RF electric power" supplied to the metal block 251 from the RF bias power supply 207, "supply of processing gas" fed into the processing chamber 200 from the shower plate 205, on and off of "supply of helium (He) gas" fed from the openings 311 or 313 and "pusher position" by operation of the pusher pins 260 shown in FIGS. 1 to 4 with change of time t taken in the abscissa axis.

In FIG. 7, at time 0, the wafer 220 to be processed is not carried in the processing chamber 200 and helium gas is fed through the penetration holes 310 from the openings 313 into the processing chamber 200 while the flow rate (velocity) thereof is adjusted to be a predetermined value. At this point, it is shown that supply of helium gas is "ON" in FIG. 7. The pusher pins 260 and the arm 259 are held at the lower end positions thereof and it is shown that the pusher position is "DOWN" at this point.

Next, at time t1, supply of helium gas is stopped to be "OFF", so that shift or deviation in position of the wafer 220 or generation of alien substances or contaminants due to supply of helium gas at the time that the wafer 220 is carried on the sample stage 250 in the processing chamber 200 or the wafer 220 is put on the pusher pins 260 can be suppressed. In this state, after the wafer 220 is placed on the robot and carried above the sample stage 250 in the processing chamber 200 through the passage having the gate valve opened to be stopped at predetermined position, the actuator 258 is started to be driven in response to a command at time t2 and the pusher pins 260 are started to be moved up in synchronism with carrying of the wafer 220 into the processing chamber 200.

Next, during the period τ, when the pusher pins 260 abut against the rear side of the wafer 220 and are further moved up to reach the upper end position thereof, the pusher pins 260 are held at this position (at this point, the pusher position is set to "UP"). At this state, the wafer 220 is put on the upper ends of the pusher pins 260 and the wafer 220 is delivered from the robot onto the pusher pins 260. After the robot is evacuated from above the sample stage 250, the pusher pins 260 are moved down to put the wafer 220 on the dielectric film 255 of the placement surface of the sample stage 250 and further moved down to the lower end position thereof to be stopped.

Thereafter, at time t3, DC voltage is applied to the electrode 257, so that the wafer 220 is electrostatically absorbed onto the dielectric film 255 to be held. When it is confirmed that the wafer 220 is absorbed, processing gas is started to be fed from the shower plate 205 into the processing chamber 200 and helium gas is started to be fed through the opening 313 from the openings 311 and 314 into the space between the rear side of the wafer 220 and the dielectric film 255. As described above, supply of helium gas at this time is adjusted so that the pressure of helium gas in the space is predetermined pressure by means of the valve 312.

Plasma is formed in the processing chamber 200 and the wafer 220 is processed from the time that RF electric power is started to be supplied from the RF bias power supply 207 to the sample stage 250 at time t4 until supply of RF electric power is turned off at time t5. After time t5, supply of processing gas is stopped (OFF) and supply of helium gas is also turned off. The operation is performed until time t6 that electrostatic absorption power from the DC power supply 206 to the electrode 257 is stopped (OFF).

When it is detected that electrostatic absorption of the wafer 220 is released, the actuator 258 is driven in response to command to move up the pusher pins 260, so that the wafer 220 is separated off from the upper surface of the dielectric film 255 and is lifted up to be moved to the upper end position and stopped (UP state). Thereafter, the wafer 220 is delivered to the robot moved above the sample stage 250 in the processing chamber 200 during the periods from time t7.

When it is detected that the wafer 220 is delivered and the robot is evacuated from above the sample stage 250 or from the processing chamber 200, helium gas is started to be fed from openings 313 and 311 and the flow rate thereof is adjusted to be predetermined value. Thereafter, the actuator 258 is operated in response to command, so that the pusher pins 260 are moved down to be housed in the penetration holes 310 and reach the lower end position and stopped (DOWN state).

Thereafter, helium gas is fed while the flow rate thereof is adjusted until supply of helium gas is stopped (OFF) at time t9. Meanwhile, the wafer 220 is not carried to the processing chamber 200, although when plasma is formed in order to clean the surfaces of members in the processing chamber 200 as described later, the pusher pins 260 may be moved up to be exposed to plasma, so that products and particles stuck on the pusher pins may be reduced by plasma. Furthermore, helium gas may be fed into the processing chamber from the openings 311 during formation of plasma.

Thereafter (after plasma disappears in case where plasma for cleaning is formed), the wafer 220 passes through the path formed by opening the gate valve and is put on the robot to be carried above the sample stage 250 in the processing chamber 200 to be stopped. Thereafter, the actuator 258 is started to be driven in response to command at time t10 to move up the pusher pins 260, so that the pusher pins 260 abut against the rear side of the wafer 220 and are further moved up to be stopped after the pusher pins 260 reach the upper end position (UP state). In this state, the wafer 220 is put on the upper ends of the pusher pins 260 and delivered to the pusher pins 260 from the robot.

After the robot is evacuated above the sample stage 250 or out of the processing chamber 200, the pusher pins 260 are moved down and the wafer 220 is put on the dielectric film 255 of the placement surface. Even thereafter, the pusher pins 260 are further moved down and reach the lower end position to be stopped. Then, the electrostatic absorption is performed at time t11 and the wafer 220 is started to be processed in the same manner as above.

In the embodiment, in delivery of the wafer 220, supply of helium gas is stopped before the robot is moved above the sample stage 250 and after the delivery is ended and the robot is evacuated from above the sample stage 250, supply of helium gas is resumed, although supply of helium gas may be made in accordance with requirements when the wafer 220 is put on the pusher pins 260 and the opening 311 is exposed to the inside of the processing chamber 200. For example, supply of helium gas may be stopped while the wafer 220 not to be processed is put on the upper ends of the pusher pins 260 and moved down and after the wafer 220 is absorbed, supply of helium gas is resumed or supply of helium gas may be resumed while the upper ends of the pusher pins 260 abut against the rear side of the wafer 220 and the wafer is separated off from the dielectric film 255 to be moved up.

According to the embodiment, it is suppressed that gas, products or particles from the processing chamber 200 go into the penetration holes 310 from the openings 311 and interact with the outer peripheries of the pusher pins 260, the surfaces of the bosses 303 constituting the inner walls of the penetration holes 310 and the inner wall surfaces of the bellows flanges 301 to produce reaction products and deposits and hence form alien substances or contaminations so that the surfaces of members in the processing chamber 200 and the wafer 220 are contaminated, and the reliability of the vacuum processing apparatus 100 is improved.

Figure 5:
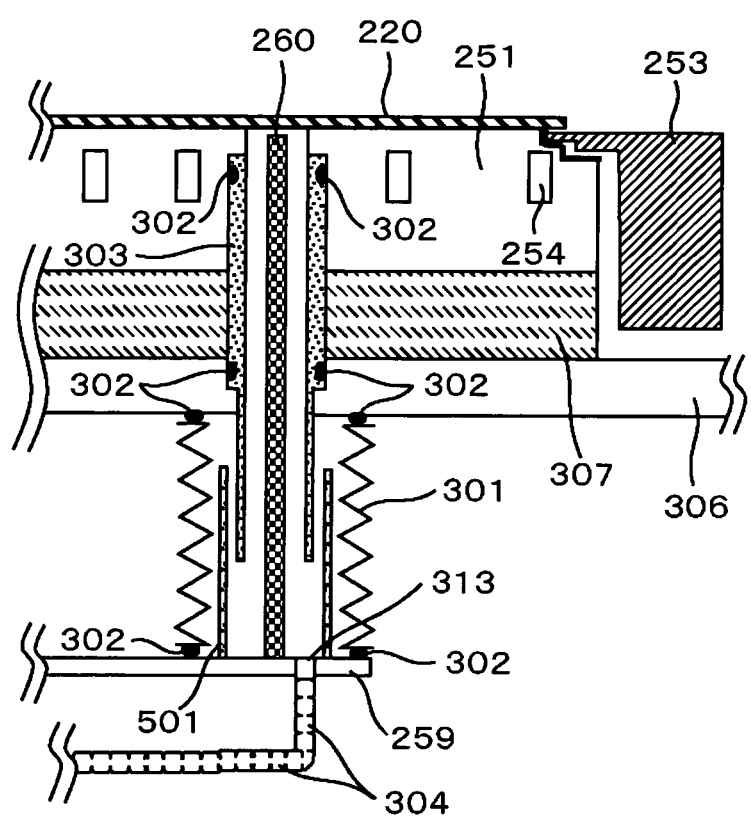
FIG. 5 is a longitudinal sectional view schematically illustrating the structure of a sample stage according to a modification example of the embodiment shown in FIG. 1.

FIG. 5 illustrates a modification example of the embodiment shown in FIG. 1. The modification example is different from the structure of the embodiment shown in FIG. 3 in that a plurality of cylinders are disposed in the bellows flanges 301 disposed below the metal base plate 306 to cover the inner surfaces of the bellows flanges 301 and the pusher pins 260 are disposed in the cylinders, whereas in the structure of the embodiment shown in FIG. 3 the distance on the lower side of the bosses 303 is limited and the lower extension part of the bosses 303 does not cover the lower part of the inner surface of the bellows flanges 301.

As shown in FIG. 5, a cylindrical boss 501 is disposed above the arm 259. The boss 501 is formed concentrically with the boss 303 and has the diameter larger than that of the boss 303. The outer periphery of the pusher pin 260 is covered by a plurality of members including the bosses 303 and 501. The pusher pin 260 and the boss 501 are disposed to form gap between the outer periphery of the pusher pin 260 and the inner surface of the boss and to prevent them from coming into contact with each other by vertical movement of the arm 259. Similarly, the pusher pin 260 and the boss 303 are disposed to form gap between the side wall surface of the pusher pin 260 and the boss 303 and to prevent them from coming into contact with each other and accordingly the pusher pin 260 and the bosses 303 and 501 are disposed concentrically with each other in a multiplexed manner.

As described above, the boss 501 is disposed between the inner wall of the lower part of the bellows flange 301 and the pusher pin 260 to form gaps between the boss 501 and them to cover one from the other. The boss 501 is coupled to the upper surface of the arm 259 and moved up and down with the vertical movement of the arm 259. The position in height of the upper end of the boss 501 is decided so that the upper end of the boss 501 is positioned separately by predetermined space from the lower surface of the metal base plate 306 when the arm 259 or the pusher pin 260 reaches the upper end position and the upper end of the boss 501 is prevented from colliding with the metal base plate 306 when the pusher pin 260 is moved up and down.

Furthermore, the upper end of the boss 501 is positioned to be higher than the lower end of (the extension part of) the boss 303 when the arm 259 or the pusher pin 260 reaches the lower end position. That is, the lower part of the extension part of the boss 303 and the upper part of the boss 501 overlap each other partially as a minimum in the radial direction from the center thereof within the vertical movement range of the arm 259 or the pusher pin 260, so that the outer periphery of the pusher pin 260 is surrounded in a multiplexed manner (doubly in this example).

With such structure, the whole inner surface of the bellows flange 301 is obstructed by at least one cylindrical member from the pusher pin 260. Moreover, the extension part of the boss 303 having a small diameter is disposed above inside the boss 501 and the boss 501 having a larger diameter is disposed below. In addition to the fact that helium gas fed from the opening 313 to fill the space in the bellows flange 301 with helium gas and to be pressurized high is introduced from the opening 311 into the processing chamber 200, the distance until particles going into the penetration holes 310 from the opening 311 reaches the inner wall of the bellows flanges 301 can be increased to thereby suppress contaminations and alien substances from being produced in the bellows flanges 301 according to the embodiment shown in FIG. 3 and further reduction of alien substances and metal contaminations can be effected according to the embodiment shown in FIG. 3, so that the reliability of the vacuum processing apparatus 100 can be improved. The gap between the bosses 303 and 501 is desirably small for attainment of the gas diffusion and screening effect.

Figure 6:
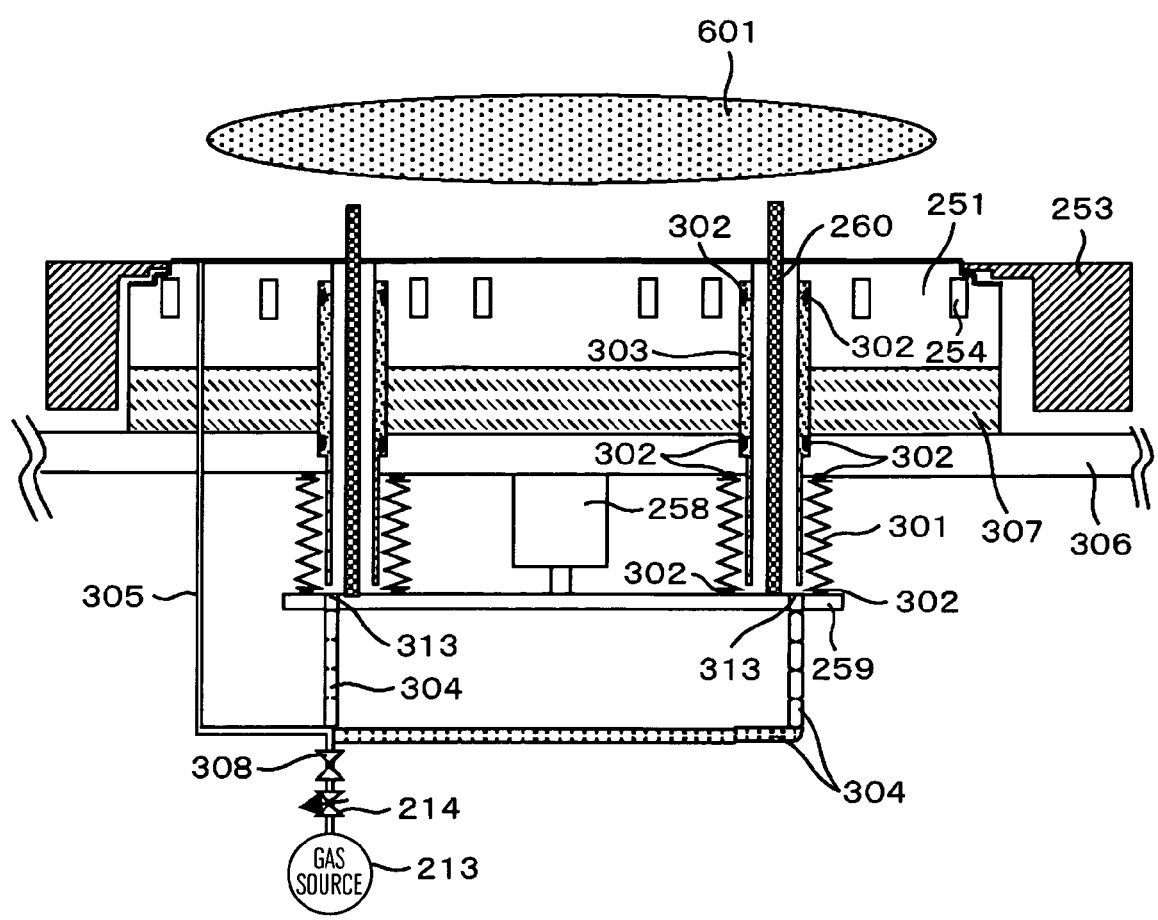
FIG. 6 is a longitudinal sectional view schematically illustrating the state that pusher pins are protruded upward from opening in the state that plasma is formed in a processing chamber in the sample stage according to the embodiment shown in FIG. 1 or the modification example shown in FIG. 5.

FIG. 6 schematically illustrates the state that the pusher pins 260 are protruded upward from the openings 311 in the state that plasma is formed in the processing chamber 200 in the vacuum processing apparatus according to the embodiment of FIG. 1 or the modification example shown in FIG. 5. In FIG. 6, the pusher pins 260 are exposed to the processing chamber 200 in the state that plasma is formed in the processing chamber, although the same structure can be attained even in the modification example of FIG. 5.

In FIG. 6, plasma 601 is formed in the processing chamber 200 while gas is fed from the shower plate 205 shown in FIG. 2 and in the state that the formation of plasma is kept, the pusher pins 260 are moved and the upper ends thereof is held above the dielectric film 255. Particularly, in this example, the arm 259 or the pusher pins 260 are held at the upper end position and the lower end of the extension part of the boss 303 and the upper surface of the arm 259 approach each other, so that substantially all of the inner surface of the bellows flange 301 is covered by the boss 303. Furthermore, helium gas is fed from the opening 313 and introduced from the opening 311 into the processing chamber 200.

In FIG. 6, the wafer 220 is not put on the pusher pins 260. Such a state occurs when the gate valve is closed and deposits stuck on the surface of the members on the inner side of the processing chamber 200 is removed by means of plasma 601 between carrying out and in of the wafer 220 in the processing chamber 200. In such formation of the plasma 601, argon (Ar) or xenon (Xe) which is inert gas is used in the processing chamber 200. When plasma 601 is formed using active gas, helium gas which is inert gas is fed from the openings 313 or 311, so that high effects can be expected in cleaning of the surface of the pusher pins 260, removal of deposits and suppress of trash and particles produced by cleaning from entering from the openings 311.

A large amount of helium gas is desirably fed, although the amount of helium gas must be limited to the degree that cleaning of members in the processing chamber 200 which is main effect by discharging of plasma 601 is not impeded. Furthermore, helium gas is continuously introduced when the wafer 220 is not put on the sample stage 250 regardless of processing of plasma 601, so that influence of remaining gas and entering of floating alien substances can be impeded continuously and it is more effective.

In the embodiment and the modification example, movement and operation of the robot, the gate valves and the pusher pins, operation of the high-frequency power supply 221, supply of electric field by the high-frequency power supply 221 from the antenna 201 to the processing chamber 200, operation of the magnetic field forming device 202, supply of magnetic field by the magnetic field forming device 202 to the processing chamber 200, operation of the exhaust pump 203 and the vacuum exhaust valve 204, supply of processing gas from the shower plate 205, supply of electric power from the DC power supply 206 and the RF bias power supply 207 and operation of the gas supply adjustment valve 214 and the actuator 258 are performed in response to command issued from the controller not shown. Operation state, electrostatic absorption and position of the arm 259 or the pusher pins 260 required for adjustment of operation are detected by the sensors under the control of the controller.

The controller of the embodiment and the modification example includes an arithmetic and control unit such as a central processing unit (CPU) constituted by semiconductor devices and the like, a memory device such as a random access memory (RAM) and a flash read only memory (ROM) for storing therein data from sensor, information and programs and interfaces for transmitting and receiving signals. Further, the controller is connected to be able to transmit and receive signals from devices and sensors to be controlled by the controller.

As described above, according to the embodiment or the modification example, there can be provided the plasma processing apparatus and its operation method in which production of alien substances is suppressed to improve the reliability.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An operation method of a plasma processing apparatus including a processing chamber disposed in a vacuum container, the processing chamber having a reduced pressure and having plasma generated therein, a sample stage disposed in a lower part of the processing chamber, the sample stage having an upper surface on which a wafer to be processed by plasma is located, a plurality of pins disposed in through holes in the sample stage so as to enable movement of the plurality of pins in a vertical direction and to enable the plurality of pins to abut against a rear side of the wafer and to move the wafer up and down with respect to the upper surface of the sample stage, and a plurality of openings disposed in the upper surface of the sample stage respectively communicated with the plurality of through holes disposed in the sample stage so that the plurality of pins are respectively movable in the plurality of through holes, the method comprising the step of:

feeding gas from supply ports communicating with the inside of the through holes into the processing chamber through the openings in the upper surface of the sample stage while plasma is generated in the processing chamber above the sample stage and upper ends of the plurality of pins are maintained above the upper surface of the sample stage in a state that the wafer is not located on the plurality of pins.

2. An operation method of a plasma processing apparatus according to claim 1, wherein the inside of the openings is pressurized to be higher than the inside of the processing chamber by introduction of gas.

3. An operation method of a plasma processing apparatus according to claim 1, wherein the plasma processing apparatus comprises bellows disposed under the openings so as to cover around a lower part of at least one of the pins and to be extended and contracted with vertical movement of the at least one of the pins, a space in the bellows being filled with the gas fed from the gas supply ports.

4. An operation method of a plasma processing apparatus according to claim 3, the plasma processing apparatus comprises two upper and lower pipe members disposed in the bellows to cover around the lower part of the at least one of the pins, the lower pipe member being moved up and down with movement of the at least one of the pins, at least part of the lower pipe member overlapping the upper pipe member through a gap so as to cover the pin doubly when the at least one of the pins is housed in the sample stage.

5. An operation method of a plasma processing apparatus according to claim 3, wherein the plasma processing apparatus comprises a sealing member to seal the space in the bellows from outside airtightly.

6. An operation method of a plasma processing apparatus including a processing chamber disposed in a vacuum container, the processing chamber having a reduced pressure and having plasma generated therein, a sample stage disposed in a lower part of the processing chamber, the sample stage having an upper surface on which a wafer to be processed by plasma is located, a plurality of pins disposed in through holes in the sample stage so as to enable movement of the plurality of pins in a vertical direction and to enable the plurality of pins to abut against a rear side of the wafer and to move the wafer up and down with respect to the upper surface of the sample stage, and a plurality of openings disposed in the upper surface of the sample stage respectively communicated with the plurality of through holes disposed in the sample stage so that the plurality of pins are movable in the respective through holes, a plurality of bellows disposed under the openings so as to cover around a lower part of each of the pins and to be extended and contracted with vertical movement of the pins, a space in the bellows being filled with the gas fed from the gas supply ports communicating with the inside of the through holes, two upper and lower pipe members disposed in at least one of the bellows to cover around the lower part of the at least one of the pins, the lower pipe member being moved up and down with movement of the at least one of the pins, at least part of the lower pipe member overlapping the upper pipe member through a gap so as to cover the pin doubly when the at least one of the pins is housed in the sample stage, the method comprising the step of:

feeding gas from supply ports communicating with the inside of the through holes into the processing chamber through the openings in the upper surface of the sample stage while the plasma is generated in the processing chamber above the sample stage and the wafer is not located above the upper surface of the sample stage.

7. An operation method of a plasma processing apparatus according to claim 6, wherein the inside of the openings is pressurized to be higher than the inside of the processing chamber by introduction of gas.

8. An operation method of a plasma processing apparatus according to claim 6, wherein the plasma processing apparatus comprises a sealing member to seal the space in the bellows from outside airtightly.

* * * * *